United States Patent
Wyatt

(10) Patent No.: US 7,590,473 B2
(45) Date of Patent: Sep. 15, 2009

(54) THERMAL MANAGEMENT USING AN ON-DIE THERMAL SENSOR

(75) Inventor: David A. Wyatt, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/357,493

(22) Filed: Feb. 16, 2006

(65) Prior Publication Data

US 2007/0191993 A1    Aug. 16, 2007

(51) Int. Cl.
*G05D 23/00* (2006.01)
*G11C 11/34* (2006.01)
*G11C 7/04* (2006.01)

(52) U.S. Cl. .................................. 700/299; 365/212
(58) Field of Classification Search ................. 700/299, 700/300; 365/211–213
See application file for complete search history.

(56) References Cited

U.S. PATENT DOCUMENTS

| 3,835,458 | A * | 9/1974 | Mrazek ........................ 365/211 |
| 5,498,971 | A * | 3/1996 | Turnbull et al. ............... 324/760 |
| 5,867,384 | A * | 2/1999 | Drees et al. ...................... 700/42 |
| 6,081,751 | A * | 6/2000 | Luo et al. ........................ 700/42 |
| 6,216,235 | B1 * | 4/2001 | Thomas et al. ............... 713/501 |
| 6,369,716 | B1 * | 4/2002 | Abbas et al. ................... 340/632 |
| 6,424,873 | B1 * | 7/2002 | Przybylski ..................... 700/42 |
| 6,463,396 | B1 * | 10/2002 | Nishigaki ..................... 702/132 |
| 6,545,494 | B1 * | 4/2003 | Olsen et al. ................... 324/760 |
| 6,552,561 | B2 * | 4/2003 | Olsen et al. ................... 324/760 |
| 6,701,272 | B2 | 3/2004 | Cooper et al. |
| 6,701,273 | B2 * | 3/2004 | Nishigaki et al. ............ 702/132 |
| 6,778,453 | B2 * | 8/2004 | Cooper et al. ................ 365/212 |
| 6,798,706 | B2 * | 9/2004 | Barth et al. ................... 365/211 |
| 6,844,752 | B1 * | 1/2005 | Cascella ....................... 324/765 |
| 6,948,082 | B2 * | 9/2005 | Gschwind et al. ........... 713/320 |
| 7,102,417 | B2 * | 9/2006 | Gordon et al. ............... 327/512 |
| 7,120,549 | B2 * | 10/2006 | Lee .............................. 702/99 |
| 7,194,593 | B2 * | 3/2007 | Schnepper ................... 711/170 |
| 7,222,197 | B2 * | 5/2007 | Jeddeloh ....................... 710/22 |
| 7,259,585 | B2 * | 8/2007 | Brinkman et al. ............. 326/30 |
| 7,260,007 | B2 * | 8/2007 | Jain et al. ..................... 365/212 |
| 7,437,579 | B2 * | 10/2008 | Jeddeloh et al. ............. 713/300 |
| 7,450,456 | B2 * | 11/2008 | Jain et al. ..................... 365/212 |
| 2003/0210598 | A1 | 11/2003 | Alexander et al. |
| 2004/0199730 | A1 | 10/2004 | Eggers et al. |
| 2005/0135430 | A1 | 6/2005 | Le et al. |
| 2005/0174164 | A1 * | 8/2005 | Fuhrmann et al. ........... 327/536 |
| 2005/0199730 | A1 | 9/2005 | Silverbrook et al. |
| 2005/0201188 | A1 | 9/2005 | Donze et al. |

(Continued)

OTHER PUBLICATIONS

Pending U.S. Appl. No. 11/305,519, filed Dec. 16, 2005, Inventor: David A. Wyatt.

(Continued)

*Primary Examiner*—M. N. Von Buhr
(74) *Attorney, Agent, or Firm*—Philip A. Pedigo LLC

(57) ABSTRACT

Embodiments of the invention are generally directed to systems, methods, and apparatuses for thermal management using an on-die thermal sensor. In some embodiments, an integrated circuit (e.g., a memory controller) includes temperature collection logic and control logic. The temperature collection logic receives and stores temperature data from a plurality of remote memory devices each having an on-die thermal sensor. In some embodiments, the control logic controls a thermal throttle based, at least in part, on the temperature data. Other embodiments are described and claimed.

16 Claims, 6 Drawing Sheets

U.S. PATENT DOCUMENTS

2006/0145667 A1* 7/2006 Matsui et al. ............... 320/150
2006/0159156 A1* 7/2006 Lee et al. .................... 374/183
2006/0242447 A1* 10/2006 Radhakrishnan et al. .... 713/501
2007/0211548 A1* 9/2007 Jain et al. ................... 365/211

OTHER PUBLICATIONS

Pending U.S. Appl. No. 11/093,905, filed Mar. 30, 2005, Inventor: Sandip Jain, et al.

Pending U.S. Appl. No. 10/955,154, filed Sep. 30, 2004, Inventor: Sandeep Jain, et al.

International Search Report for corresponding matter P22929PCT dated Aug. 14, 2007.

International Preliminary Report on Patentability for corresponding foreign matter P22929PCT dated Aug. 28, 2008.

* cited by examiner

THERMAL MANAGEMENT USING AN ON-DIE THERMAL SENSOR

TECHNICAL FIELD

Embodiments of the invention generally relate to the field of integrated circuits and, more particularly, to systems, methods and apparatuses for thermal management using an on-die thermal sensor.

BACKGROUND

Memory is frequently packaged on modules that contain several similar (or identical) integrated circuits (or, for ease of reference, chips), such as dynamic random access memory (DRAM) devices. The memory module may include conductive traces laminated onto a non-conductive substrate (e.g., a printed circuit board or, simply a PCB). Examples of memory modules include dual inline memory modules (DIMMs) and small outline DIMMs (SO-DIMMs).

The temperature of a semiconductor memory (e.g., DRAM) is largely determined by its activity level (e.g., the rate of reads and writes into the memory cells). If the temperature of the memory is too high, then the data stored in the memory may be corrupted or lost. In addition, the memory may be damaged by excessively high temperatures. The temperature of each memory device on a memory module may be different depending on factors such as its level of use, available cooling, and its own unique characteristics. The thermal constraints of memory devices may limit the maximum data access rates that memory device interfaces can support.

Conventional approaches to addressing the thermal constraints of a memory system typically include an external thermal sensor. That is, they typically include a thermal sensor that is affixed to the external portions of a memory module. For example, the thermal sensor may be affixed to one side of a PCB (e.g., to one side of a DIMM or an SO-SIMM). This thermal sensor detects the temperature of the PCB and attempts to infer an approximate temperature of the memory devices based on the temperature of the PCB. The remote thermal sensor may have the capability to trigger an event when a preprogrammed thermal threshold is reached.

There are a number of limitations to the conventional approach of addressing thermal constraints in a memory system. Memory modules are frequently coplanar with the main system board. This means that one face of the memory module is facing the main system board and another face of the module is facing away from the board. Each side of the memory module is likely to have a different temperature and a single thermal sensor affixed to one side of the module will be unlikely to infer an accurate temperature for the opposing side of the module.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to systems, methods, and apparatuses for thermal management using an on-die thermal sensor. In some embodiments, an integrated circuit (e.g., a memory controller) includes temperature collection logic and control logic. The temperature collection logic receives and stores temperature data from a plurality of remote memory devices each having an on-die thermal sensor. In some embodiments, the control logic controls provides a thermal control mechanism based, at least in part, on the temperature data. Other embodiments are described and claimed.

Figure 1:
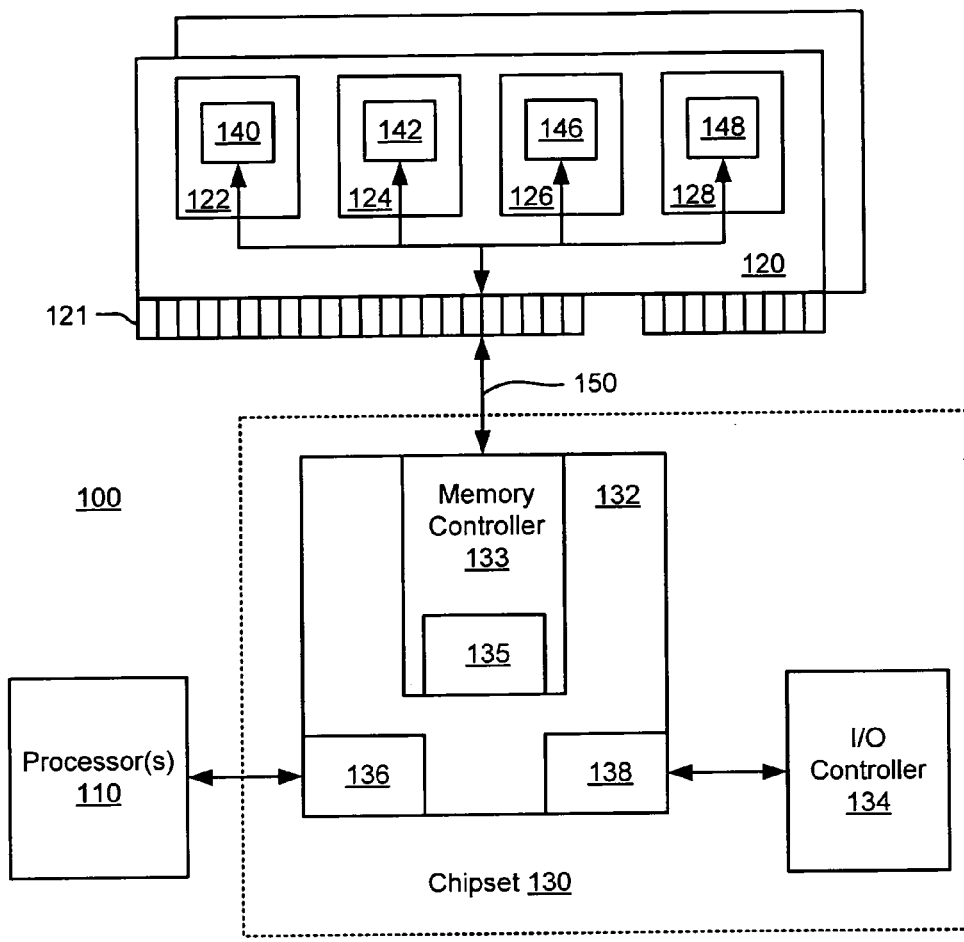
FIG. 1 is a high-level block diagram illustrating selected aspects of a computing system, implemented according to an embodiment of the invention.

FIG. 1 is a high-level block diagram illustrating selected aspects of a computing system implemented according to an embodiment of the invention. Computing system 100 includes processor(s) 110, memory module(s) 120, and chipset 130. Processor 110 operates on data stored on, for example, memory module 120. Processor 110 may be, for example, a central processing unit, an embedded processor, a partitioned processor, a multicore processor, and the like.

Memory module(s) 120 may have any of a wide variety of structures and pin configurations. For example, memory module 120 may be structured as a DIMM, an SO-DIMM, a micro DIMM, and the like. Electrical contact connector 121 may have nearly any pin configuration including 240-pin, 144-pin, 72-pin, etc.

Memory module 120 includes memory devices 122-128. For ease of illustration four memory devices are shown. It is to be appreciated that embodiments of the invention may include more memory devices or fewer memory devices. Memory devices 122-128 may be any of a wide variety of memory devices including, for example, DRAMs.

In some embodiments, each memory device 122-128 includes a corresponding on-die thermal sensor 140-148. The term "on-die" refers to the disposition of thermal sensors 140-148 on the same die as corresponding memory devices 122-128. An on-die thermal sensor may be any of a wide range of on-die thermal sensors including, for example, a thermal diode. In contrast to conventional systems, on-die thermal sensors 140-148 are able to detect actual device temperatures for memory devices 122-128 because they are internal to the memory device packages. In addition, in embodiments in which each memory device includes a corresponding on-die thermal sensor, the temperature of every memory device can be individually detected. As is further discussed below, this allows a thermal management system to mitigate for temperature differences that are due to, for example, differences in air flow across a memory module.

In alternative embodiments, only a selected subset of memory devices 122-128 includes an on-die thermal sensor 140-148. For example, in some embodiments, every Nth (e.g., second, third, fourth, etc.) memory device may have an on-die thermal sensor. Alternatively, at least one memory device on each side of memory module 120 may include an on-die thermal sensor. In yet other embodiments, at least one memory device on memory module 120 includes an on-die thermal sensor.

Chipset 130 includes a group of integrated circuits that work together to transfer information to and from processor 110. In the illustrated embodiment, chipset 130 includes memory controller hub 132 and I/O controller 134. Memory controller hub 132 provides an interface between processor 110 and, for example, memory module 120 and I/O controller 134.

Memory controller hub 132 includes memory controller 133, processor interconnect interface (I/F) 136, and I/O interconnect I/F 138. Processor interconnect I/F 136 may provide an interface to, for example, a front-side bus or a cache coherent interconnect. I/O interconnect I/F may provide an interface to any of a wide range of I/O interconnects including those based on Peripheral Component Interconnect Express (PCIe) technology.

In some embodiments, memory controller 133 includes thermal collection and control logic 135. Thermal collection and control logic 135 collects temperature data from on-die thermal sensors 140-148. The term "temperature data" broadly refers to digitized information that provides an indication of device temperature. The term "temperature data" may also include digitized information that indicates whether one or more temperature thresholds have been crossed. In some embodiments, thermal collection and control logic 135 processes the temperature data and provides thermal management for memory devices 122-128 based on the result. Thermal collection and control logic 135 is further discussed below with reference to FIGS. 2-6.

In an alternative embodiment, chipset 130 may include more or fewer integrated circuits. In addition, the functions provided by memory controller hub 132 and/or I/O controller 134 may be provided by more, fewer, and/or different integrated circuits. For example, in some embodiments, memory controller 133 is implemented on the same die as processor 110.

Figure 2:
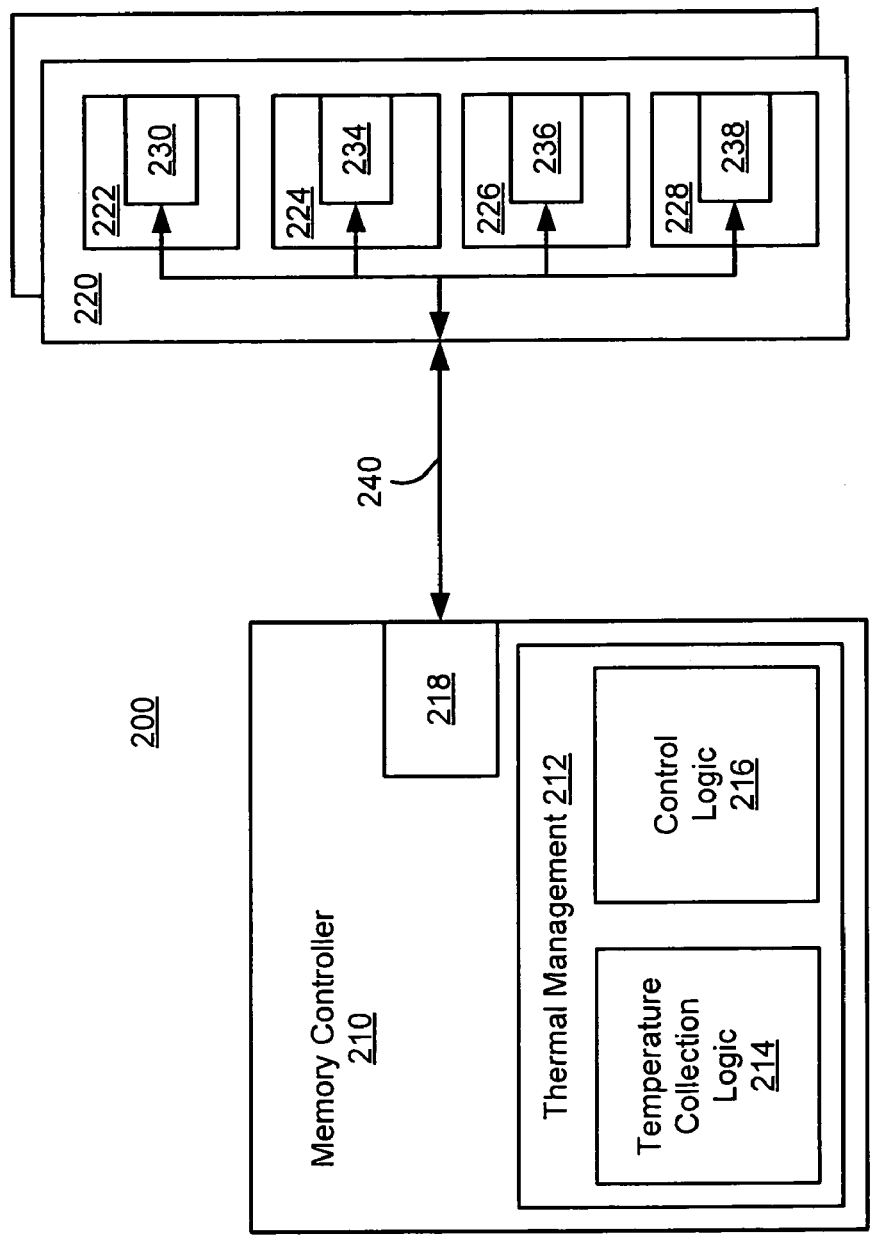
FIG. 2 is a high-level block diagram of selected aspects of a thermal management system, implemented according to an embodiment of the invention.

FIG. 2 is a high-level block diagram of selected aspects of a computing system implemented according to an embodiment of the invention. Computing system 200 includes memory controller 210 and memory module 220 coupled together through memory interconnect 240. Memory interconnect 240 transports memory data, address information, and the like between memory controller 210 and memory module 220. In some embodiments, memory interconnect 240 is a multi-drop memory bus. In other embodiments, memory interconnect 240 is a point-to-point interconnect. In yet other embodiments, memory interconnect 240 is a cache coherent interconnect.

Memory module 220 includes memory devices 222-228. In some embodiments, memory devices 222-228 are commodity-type dynamic random access memory (DRAM) such as Double Data Rate II (DDR2) DRAM. In alternative embodiments, a different type of memory devices may be used. Memory devices 222-228 include on-die thermal sensors 230-238. On-die thermal sensors 230-238 detect the temperatures of corresponding memory devices 222-228 and send the detected temperature data to memory controller 210 through interconnect 240.

In some embodiments, the existing memory interconnect signaling and architecture is leveraged to transport the temperature data. For example, the temperature data may be sent to memory controller 210 by multiplexing the temperature data on an existing memory interconnect 240. The temperature data may be multiplexed during convenient intervals such as memory interface quiet time. For example, the temperature data may be read during refresh cycles, bus calibration cycles, and the like. Thus, embodiments of the invention may be implemented without extra signaling for thermal management.

Memory controller 210 includes thermal management system 212 and memory interconnect I/F 218. In some embodiments, thermal management system 212 collects and processes temperature data from thermal sensors 230-238. In addition, thermal management system 212 may include thermal control mechanisms to trigger a response if the temperature of memory devices 222-228 exceeds a threshold (or a policy associated with the threshold). As is further described below, thermal management system 212 enables memory controller 210 to collect, process, and/or respond to temperature data provided by on-die thermal sensors 230-238.

In some embodiments, thermal management system 212 includes temperature collection logic 214 and control logic 216. Temperature collection logic 214 receives, stores, and processes temperature data from memory devices 222-228. Temperature collection logic 214 may include, for example, collection registers, collection control registers, computation registers, and the like. Control logic 216 includes logic to initiate a thermal control mechanism, if the temperature data (or processed temperature data) exceeds the threshold value. Control logic 216 may include temperature trip control registers and event steering logic. Thermal management system 212 is further described below with reference to FIGS. 3-6.

It is to be appreciated that, in some embodiments, the functions of temperature collection logic 214 and control logic 216 may be distributed in a different manner. For example, in some embodiments, control logic 216 may process the temperature data stored by collected logic 212. In addition, thermal management system 212 may include more elements, fewer elements, and/or different elements than those shown in FIG. 2.

Figure 3:
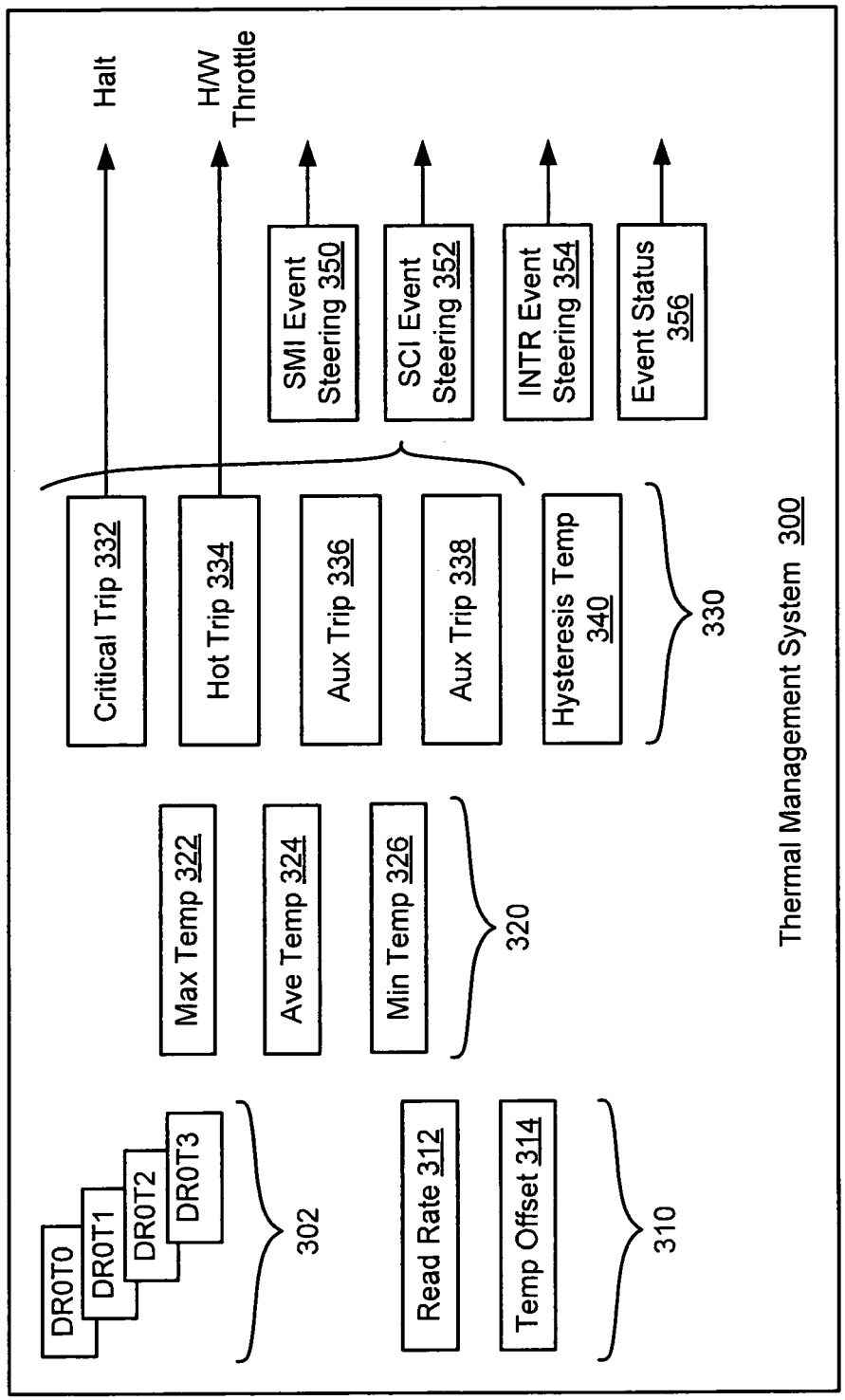
FIG. 3 is a block diagram illustrating selected aspects of thermal management system implemented, according to an embodiment of the invention.

FIG. 3 is a block diagram illustrating selected aspects of a thermal management system implemented according to an embodiment of the invention. In some embodiments, thermal management system 300 is on the same die as a computing system's memory controller. The memory controller may, in turn, be on the same die as a processor or it may be part of the system's chipset. In yet other embodiments, thermal management system 300 may be implemented on a different chip within the chipset.

Temperature collection registers 302 store temperature data that is collected from corresponding memory devices (e.g., memory devices 222-228, shown in FIG. 2). In some embodiments, each temperature collection register 302 stores temperature data for a rank of memory (e.g., Rank 0, Rank 1, . . . Rank N). Temperature collection registers 302 may be implemented as any of a wide array of registers including, for example, shift registers. In some embodiments, each time the temperature data is read over a memory interconnect, it is stored in temperature collection registers 302. The registers 302 used for each successive read may be rotated so that the collection of registers 302 represents the history of recent samples.

Temperature collection control registers 310 store control values for thermal management system 300. In the illustrated embodiment, collection control registers 310 include read rate register 312 and temperature offset register 314. In an alternative embodiment, collection control registers 310 may include more registers, fewer registers, and/or different registers. The read rate value stored in register 312 determines the rate at which data is read from one or more remote on-die thermal sensors (e.g., thermal sensors 230-238, shown in FIG. 2).

Temperature offset register 314 stores one or more offset values that may be used to adjust temperature data that is read from the remote on-die thermal sensors. In some embodiments, the temperature data reported by the on-die thermal sensors includes a calibration error. For example, the thermal sensors may report a relative temperature rather than an absolute temperature. The offset value(s) stored in register 314 may be used to, for example, adjust relative temperature values to absolute temperature values.

In some embodiments, thermal management system 300 processes the collected temperature data. For example, thermal management system 300 may calculate average temperature(s), moving average temperature(s), minimum temperature(s), maximum temperature(s), and the like. In an alternative embodiment, more calculations, fewer calculations, and/or different calculations may be made using the temperature data.

Temperature computation registers 320 may store computation values associated with processing the temperature data. In the illustrated embodiment, computation registers 320 include maximum temperature(max temp) register(s) 322, average temperature (ave temp) register(s) 324, and minimum temperature (min temp) register(s) 326. In an alternative embodiment, computation registers 320 may include more registers, fewer registers, and/or different registers.

Max temp register(s) 322 store one or more computed maximum temperatures. Similarly, minimum temp register(s) 326 store one or more computed minimum temperatures. In some embodiments, the values stored in registers 322 and 326 are used to determine whether the temperatures of corresponding memory devices have exceeded a thermal threshold. A "trip point" refers to a threshold value that provides a thermal threshold.

Ave temp register 324 stores one or more computed average temperatures. In some embodiments, ave temp register 324 stores one or more moving average temperatures. The term "moving average" refers to an average temperature of the devices over time. The generation of a moving average may, in general, include two steps: computing an average temperature of the memory devices and computing an average temperature of the devices over time. In some embodiments, the moving average is computed using the following formula: Moving average=(last moving average+current average)/2.

Temperature trip control registers 330 store trip points and related values. There may be a number of different trip points and, as is further discussed below, some of the trip points may be programmable. Hot trip register 334 stores a value indicating a hot trip point. A hot trip point refers to a threshold which, when crossed, causes the application of an automatic hardware throttle. Critical trip register 332 stores a value indicating a critical trip point. A critical trip point refers to a threshold which, when crossed, causes a shutdown of the computing system (e.g., computing system 100, shown in FIG. 1).

As mentioned above, some of the trip points may be programmable. For example, in the illustrated embodiment, auxiliary trip registers 336 and 338 each may store one or more programmable trip points. Programmable trip points may be used to generate software events associated with automatic thermal throttling. Automatic thermal throttling is further discussed below with reference to FIG. 6.

In an embodiment, auxiliary trip registers 336 and 338 may interoperate with one or more steering registers to control the servicing of a thermal management related software event. In the illustrated embodiment, for example, auxiliary trip registers 336 and 338 may interoperate with one or more of: system management interrupt (SMI) event steering register 350, system control interrupt (SCI) event steering register 352, interrupt (INTR) event steering register 354, and/or event status register 356.

SMI event steering register 350 services management events that use a processor's SMI pin. The SMI pin can be used to trigger hard-coded, operating system independent, system level response software. SCI event steering register 352, in contrast, services events that are handled in cooperation with an operating system. SCI events are typically handled by advanced configuration and power interface (ACPI) system language (ASL) code but may also be handled by basic I/O system (BIOS) code.

In some embodiments, INTR event steering register 354 services driver level software. The driver level software may support a relatively sophisticated level of thermal management because it allows the thermal management system to be more interactive. For example, the driver level software may reference historical data (e.g., historical temperature data and calculations based on temperature data), system information, data related to other devices, and the like. The driver level software may also have additional capabilities such as the ability to turn a cooling fan on and off.

In some embodiments, a hierarchy of trip points may be used. For example, initially, the programmable trip points in registers 336 and 338 may be used to provide relatively elegant thermal control mechanisms based on software events and/or proportionally adaptive throttling mechanisms (further discussed below). If the relatively elegant mechanisms fail to keep the device temperatures below hot trip point (stored, e.g., in hot trip register 334), then hardware throttling may be used to provide thermal management. Finally, if the device temperatures continue to increase and cross the critical trip point (stored, e.g., in critical trip register 332), then the system may be shutdown to prevent or mitigate damage to the system and/or the data stored in memory.

Embodiments of the invention are not limited to the structures and functions illustrated in FIG. 3. In alternative embodiments, thermal management system 300 may have more elements, fewer elements, and/or different elements.

Figure 4:
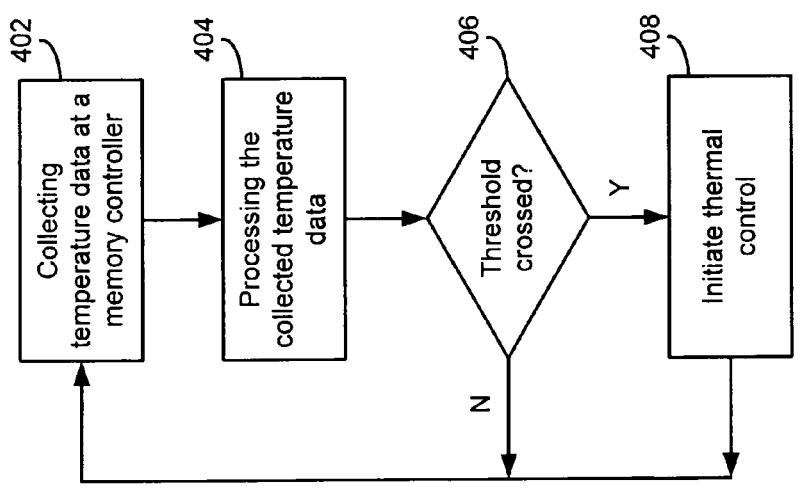
FIG. 4 is a high-level flow diagram illustrating selected aspects of collecting and processing temperature, data according to an embodiment of the invention.

FIG. 4 is a high-level flow diagram illustrating selected aspects of collecting and processing temperature data according to an embodiment of the invention. Referring to process block 402, a thermal management system (e.g., thermal management system 300, shown in FIG. 3) collects temperature data from one or more remote on-die thermal sensors. In some embodiments, the thermal management system reads the temperature data using a special command that is issued at a convenient interval. Each time the data is read, it may be stored in one of a series of temporary registers (e.g., temperature collection registers 302, shown in FIG. 3).

Referring to process block 404, the thermal management system processes the temperature data collected from the on-die sensors. In some embodiments, processing the temperature data includes making various calculations based on the data. Examples of the calculations include calculating one of the following: a maximum temperature, a minimum temperature, an average temperature, a moving average temperature, and the like. Processing the temperature data may also include calibrating the data using an offset.

Referring to process block 406, the thermal management system determines whether a thermal threshold has been reached. Determining whether a thermal management threshold has been reached may include comparing processed temperature data with a thermal threshold value. The term "processed temperature data" refers to data produced by performing calculations on temperature data. Examples of processed temperature data may include: a maximum temperature, a minimum temperature, an average temperature, a moving average temperature, and the like.

If a thermal threshold has been reached, then the thermal management system may initiate a thermal control mechanism as shown by 408. The term "thermal control mechanism" broadly refers to any function that attempts to control the temperature of a memory device or a group of memory devices. A thermal control mechanism may include a software based event and/or an automatic throttle response. Thermal control mechanisms are further discussed below with reference to FIGS. 5-6.

Figure 5:
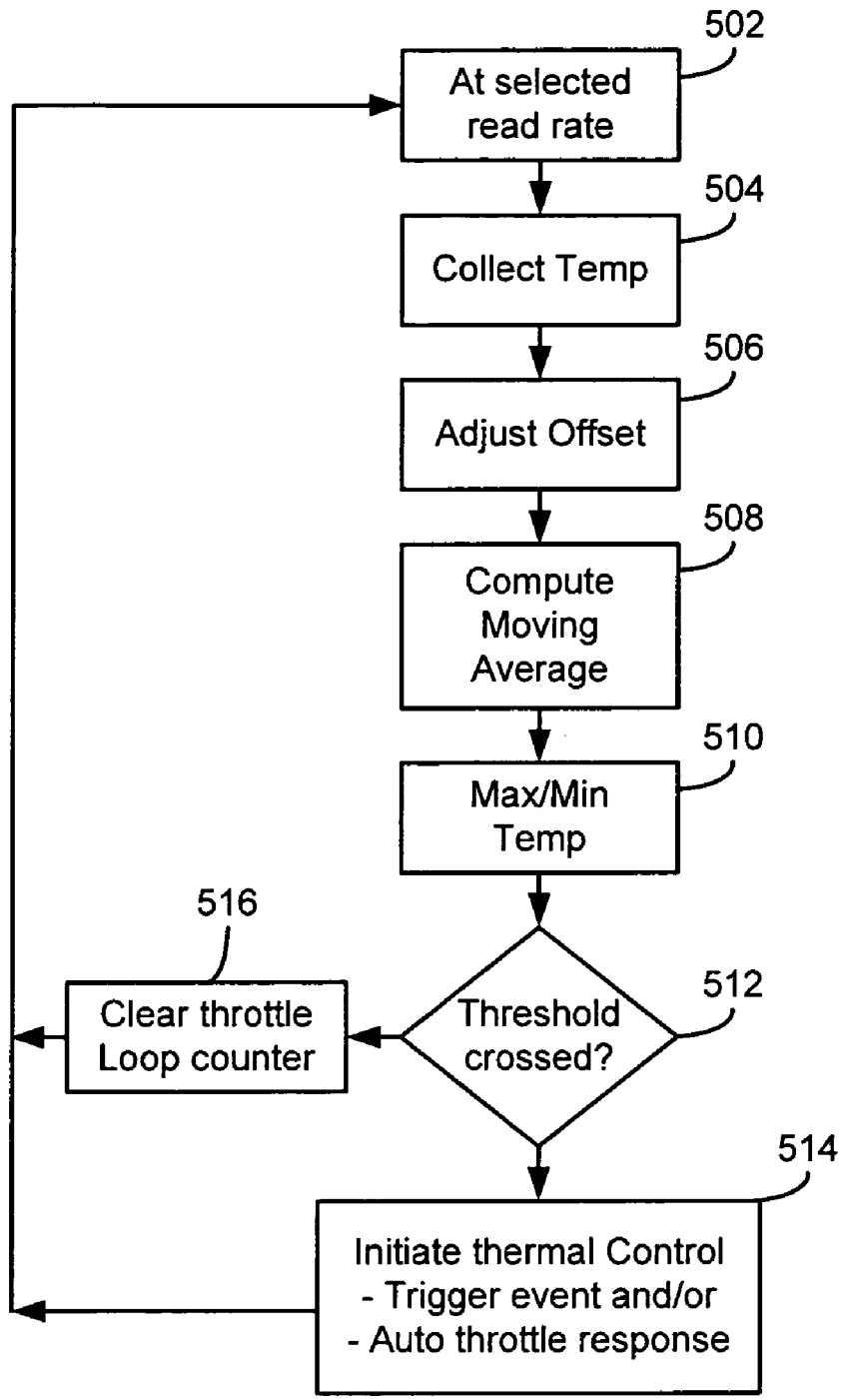
FIG. 5 is a flow diagram illustrating selected aspects of collecting and processing temperature data, according to an embodiment of the invention.

FIG. 5 is a flow diagram illustrating selected aspects of collecting and processing temperature data according to an embodiment of the invention. Referring to process block 502, temperature data is read a selected rate. In some embodiments, the read rate is determined by a value stored in a read rate register (e.g., read rate register 312, shown in FIG. 3). The read rate may correspond to a particular event such as a refresh cycle or a bus calibration cycle. In addition, the read command may be issued at some convenient frequency with respect to the event (e.g., if the event occurs more frequently than device temperature can change). For example, if the refresh occurs every 20 milliseconds, then the read command may be issued every N refresh cycles.

Referring to process block 504, the temperature data is collected from one or more remote on-die thermal sensors. In some embodiments, the temperature data is continuously collected during inactive time on a memory interconnect (e.g., during refresh cycles, interconnect calibration cycles, etc.). Each time the thermal management system collects the temperature data over the memory interconnect, it may store the data in one of a series of temporary registers (e.g., temperature collection registers 302, shown in FIG. 3). The actual temporary registers used may be rotated for each successive read so that the collection of registers represents the history of recent temperature samples.

Referring to process block 506, the temperature data may be adjusted with respect to an offset. The adjustment allows the thermal management system to account for calibration errors in the temperature data. For example, the on-die thermal sensors may report a relative temperature rather than an absolute temperature. In some embodiments, the thermal management system may adjust the relative temperature values to absolute temperature values using an offset value stored, for example, in a temperature offset register (e.g., temperature offset register 314, shown in FIG. 3).

The collected temperature data may be processed using any of a wide range of calculations, algorithms, policies, etc. Referring to process block 508, for example, a moving average is computed using the collected temperature data. Also, at 510, maximum and/or minimum temperature values are determined. In some embodiments, the thermal management system may calculate the maximum and minimum temperatures for all memory devices that have on-die thermal sensors. In alternative embodiments, the thermal management system may calculate maximum and minimum temperatures for selected subsets of memory devices (e.g., each rank, each module, each channel, etc.).

Referring to process block 512, the processed temperature data (and/or the raw temperature data) is used to detect whether memory device temperatures have crossed a thermal threshold. In some embodiments, the thermal management system may use a number of different thermal thresholds and the processed temperature data is used to determine which, if any, thresholds have been crossed. In some embodiments, hysteresis is applied to mitigate the number of thermal control events that are generated as temperatures fluctuate around a trip point. The application of hysteresis may be based on one or more hysteresis values stored, for example, in a hysteresis temperature register (e.g., hysteresis temperature register 340, shown in FIG. 3).

Referring to process block 514, the thermal control system may initiate a thermal control mechanism if the device temperatures (e.g., as indicated by the processed temperature data and/or the raw temperature data) cross one or more thermal thresholds. A thermal control mechanism may include, for example, an automatic throttle response and/or a software event. The automatic throttle response may include, for example, a hardware-based throttling of the data rate of the memory interconnect. The software events may include interrupts, SMI events, SCI events, or even a system self-shutdown. The thermal management system may use a system self-shutdown to avoid catastrophic damage and/or data loss if prior thermal control mechanisms (e.g., data rate throttling, software events, etc.) are not sufficiently effective in curbing the rise in temperatures.

Referring to process block 516, the thermal control system may initiate one or more actions if the device temperatures have not crossed a thermal threshold (or thresholds). For example, the thermal control system may clear a previously applied thermal throttle. In addition, a loop counter may be cleared to "reset" a proportionally adapted throttle mechanism. In some embodiments, a software event may be issued if the device temperatures are below one or more thermal thresholds.

The collection and computation process illustrated in FIG. 5 may be repeated at a programmable rate. The programmable rate can be increased or decreased as desired to allow detection of fast thermal transients or very slow inter-component thermal cross-influence.

As discussed above, embodiments of the invention use a thermal management system resident in, for example, the memory controller to collect and process temperature data from a number of remote on-die thermal sensors. Since the thermal management system may have continuous data about actual device temperatures it can support more elaborate automatic throttling mechanisms than were previously possible. For example, the thermal management system can derive distance from goal temperatures, rate of temperature change, and/or integral of temperature change to derive a proportional closed-loop feedback control response. This proportional closed-loop feedback response mitigates the heavy-hammer (e.g., over-guardbanding and performance reducing) throttle responses that have been typical of conventional thermal throttle mechanisms.

Figure 6:
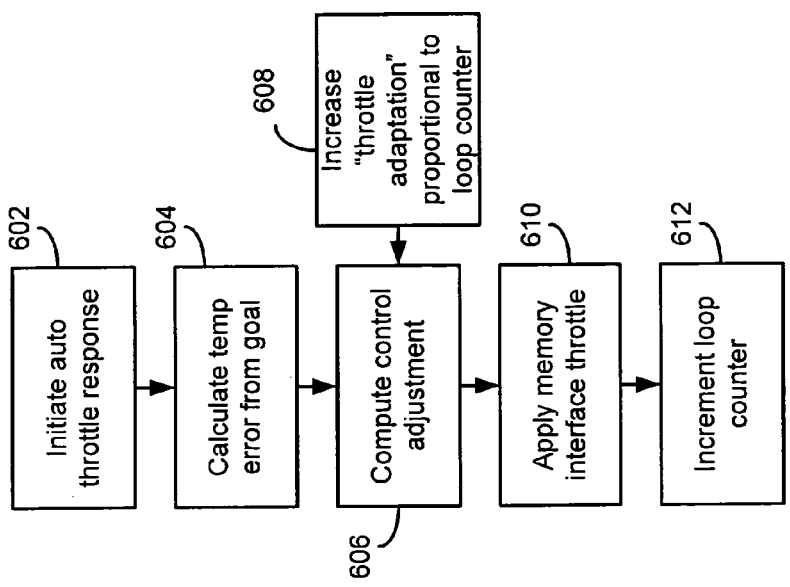
FIG. 6 is a flow diagram illustrating selected aspects of an automatic throttle response, implemented according to an embodiment of the invention.

FIG. 6 is a flow diagram illustrating selected aspects of an automatic throttle response implemented according to an embodiment of the invention. The process illustrated in FIG. 6, provides one example of a proportional closed-loop thermal management system. In alternative embodiments, the automatic throttle response may be implemented differently. As is further described below, the thermal management system applies an increasing or decreasing amount of throttle control based on the continuous stream of temperature data that it collects.

Referring to process block 602, the automatic throttle response is initiated. In some embodiments, the automatic throttle response is initiated if/when a thermal threshold is crossed (see, e.g., process block 514, shown in FIG. 5). Crossing a thermal threshold may include exceeding the threshold and/or falling below the threshold.

Referring to process block 604, the thermal management system calculates a temperature error from a goal temperature. The term "goal temperature" refers to a temperature goal for the thermal management system. The goal temperatures may be fixed or they may be configurable (e.g., by setting a value in a register). In some embodiments, calculating the temperature error includes calculating a distance from the goal temperature and/or a rate of temperature change with respect to the goal temperature. In other embodiments, different calculations may be used to determine the temperature error.

Referring to process block 606, the thermal management system computes a control adjustment. The term "control adjustment" refers to an indicator (e.g., a value, a set of values, etc.) of how much to increase or decrease the amount of thermal throttle that is applied. The thermal management system may adaptively increase or decrease the amount of thermal throttle based on any of a wide range of factors. In some embodiments, the thermal management system uses a loop counter to determine how frequently device temperatures have crossed a thermal threshold. As the counter increases, the thermal management system may proportionally increase the amount of thermal throttle that is applied. Similarly, as the counter decreases, the thermal management system may proportionally decrease the amount of thermal throttle that is applied. In alternative embodiments, the proportional increase or decrease of the thermal throttle may be based on other factors.

Referring to process block 610, the thermal management system applies a memory interface throttle. Applying the memory interface throttle may include increasing or decreasing the data rate of the memory interconnect based, at least in part, on the control adjustment computed in process block 606. In embodiments that use a loop counter, the loop counter may be incremented each time the automatic throttle is invoked as shown by 612. It is to be appreciated that automatic thermal responses implemented according to an embodiment of the invention may have more process blocks, fewer process blocks, and/or different process blocks than those shown in FIG. 6.

Figure 7:
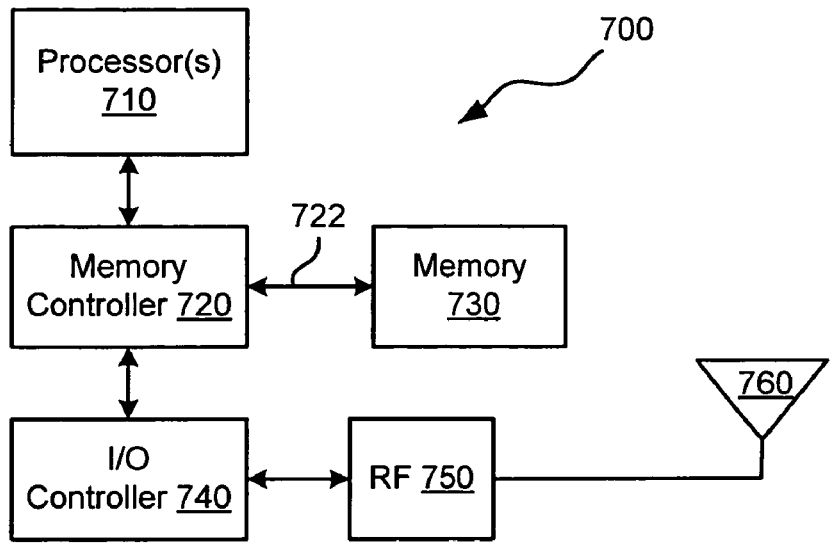
FIG. 7 is a block diagram illustrating selected aspects of an electronic system, according to an embodiment of the invention.

FIG. 7 is a block diagram illustrating selected aspects of an electronic system according to an embodiment of the invention. Electronic system 700 includes processor 710, memory controller 720, memory 730, input/output (I/O) controller 740, radio frequency (RF) circuits 750, and antenna 760. In operation, system 700 sends and receives signals using antenna 760, and these signals are processed by the various elements shown in FIG. 7. Antenna 760 may be a directional antenna or an omni-directional antenna. As used herein, the term omni-directional antenna refers to any antenna having a substantially uniform pattern in at least one plane. For example, in some embodiments, antenna 760 may be an omni-directional antenna such as a dipole antenna or a quarter wave antenna. Also, for example, in some embodiments, antenna 760 may be a directional antenna such as a parabolic dish antenna, a patch antenna, or a Yagi antenna. In some embodiments, antenna 760 may include multiple physical antennas.

Radio frequency circuit 750 communicates with antenna 760 and I/O controller 740. In some embodiments, RF circuit 750 includes a physical interface (PHY) corresponding to a communication protocol. For example, RF circuit 750 may include modulators, demodulators, mixers, frequency synthesizers, low noise amplifiers, power amplifiers, and the like.

In some embodiments, RF circuit 750 may include a heterodyne receiver, and in other embodiments, RF circuit 750 may include a direct conversion receiver. For example, in embodiments with multiple antennas 760, each antenna may be coupled to a corresponding receiver. In operation, RF circuit 750 receives communications signals from antenna 760 and provides analog or digital signals to I/O controller 740. Further, I/O controller 740 may provide signals to RF circuit 750, which operates on the signals and then transmits them to antenna 760.

Processor(s) 710 may be any type of processing device. For example, processor 710 may be a microprocessor, a microcontroller, or the like. Further, processor 710 may include any number of processing cores or may include any number of separate processors.

Memory controller 720 provides a communication path between processor 710 and other elements shown in FIG. 7. In some embodiments, memory controller 720 is part of a hub device that provides other functions as well. As shown in FIG. 7, memory controller 720 is coupled to processor(s) 710, I/O controller 740, and memory 730. In some embodiments, memory controller 720 includes a thermal management system to collect and process temperature data from on-die thermal sensors in memory 730.

Memory 730 may include multiple memory devices. These memory devices may be based on any type of memory technology. For example, memory 730 may be random access memory (RAM), dynamic random access memory (DRAM), static random access memory (SRAM), nonvolatile memory such as FLASH memory, or any other type of memory.

Memory 730 may represent a single memory device or a number of memory devices on one or more modules. Memory controller 720 provides data through interconnect 722 to memory 730 and receives data from memory 730 in response to read requests. Commands and/or addresses may be provided to memory 730 through interconnect 722 or through a different interconnect (not shown). Memory controller 730 may receive data to be stored in memory 730 from processor 710 or from another source. Memory controller 730 may provide the data it receives from memory 730 to processor 710 or to another destination. Interconnect 722 may be a bi-directional interconnect or a unidirectional interconnect. Interconnect 722 may include a number of parallel conductors. The signals may be differential or single ended. In some embodiments, interconnect 722 operates using a forwarded, multiphase clock scheme.

Memory controller 720 is also coupled to I/O controller 740 and provides a communications path between processor(s) 710 and I/O controller 740. I/O controller 740 includes circuitry for communicating with I/O circuits such as serial ports, parallel ports, universal serial bus (USB) ports and the like. As shown in FIG. 7, I/O controller 740 provides a communication path to RF circuits 750.

Figure 8:
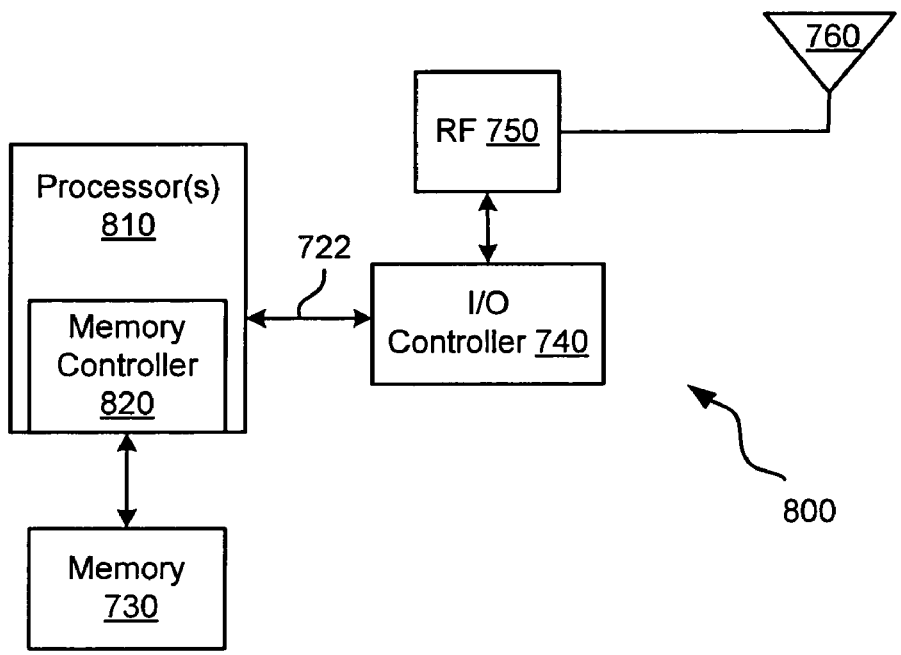
FIG. 8 is a bock diagram illustrating selected aspects of an electronic system, according to an embodiment of the invention.

FIG. 8 is a bock diagram illustrating selected aspects of an electronic system according to an embodiment of the invention. Electronic system 800 includes memory 730, I/O controller 740, RF circuits 750, and antenna 760, all of which are described above with reference to FIG. 7. Electronic system 800 also includes processor(s) 810 and memory controller 820. As shown in FIG. 8, memory controller 820 may be on the same die as processor(s) 810. In some embodiments, memory controller 820 includes a thermal management system to collect and process temperature data from on-die thermal sensors in memory 730. Processor(s) 810 may be any type of processor as described above with reference to processor 710 (FIG. 5). Example systems represented by FIGS.

7 and 8 include desktop computers, laptop computers, servers, cellular phones, personal digital assistants, digital home systems, and the like.

Elements of embodiments of the present invention may also be provided as a machine-readable medium for storing the machine-executable instructions. The machine-readable medium may include, but is not limited to, flash memory, optical disks, compact disks-read only memory (CD-ROM), digital versatile/video disks (DVD) ROM, random access memory (RAM), erasable programmable read-only memory (EPROM), electrically erasable programmable read-only memory (EEPROM), magnetic or optical cards, propagation media or other type of machine-readable media suitable for storing electronic instructions. For example, embodiments of the invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

What is claimed is:

1. A memory controller comprising:
    an interface to couple with a memory interconnect, the memory interconnect to transfer at least one of memory data or address information;
    temperature collection logic coupled with the interface to receive and store temperature data from a plurality of remote memory devices, each memory device including an on-die thermal sensor, wherein the temperature data is to be continuously collected from the plurality of remote memory devices during inactive time on the memory interconnect that couples the memory controller to the plurality of remote memory devices, and further wherein the memory devices are to multiplex the temperature data onto the memory interconnect during the inactive time; and
    control logic coupled with the temperature collection logic, the control logic to provide a thermal control mechanism based, at least in part, on the temperature data, wherein the thermal control mechanism provides a proportional closed-loop feedback control response.

2. The memory controller of claim 1, wherein the temperature collection logic comprises:
    a memory to store the temperature data from the plurality of remote memory devices.

3. The memory controller of claim 2, wherein the memory to store the temperature data from, the plurality of remote memory devices comprises:
    a temperature collection register, for each memory device, to store temperature data for the corresponding memory device.

4. The memory controller of claim 1, wherein the temperature collection logic further comprises:
    one or more temperature collection control registers to store control information for the temperature collection logic.

5. The memory controller of claim 1, wherein the control logic comprises:
    event steering logic to provide an event responsive, at least in part, to temperature data exceeding a thermal threshold value.

6. A method comprising:
    collecting, at a memory controller, temperature data from a plurality of remote memory devices, each memory device including an on-die thermal sensor, wherein the temperature data is to be continuously collected from the plurality of remote memory devices during inactive time on a memory interconnect that couples the memory controller to the plurality of remote memory devices, wherein the memory devices are to multiplex the temperature data onto the memory interconnect during the inactive time, and further wherein the memory interconnect does not have dedicated signal lines for thermal management;
    storing, in the memory controller, processed temperature data, the processed temperature data based, at least in part, on the temperature data from the plurality of remote memory devices;
    comparing the processed temperature data to a thermal threshold value; and
    initiating a thermal control mechanism, if the processed temperature data exceeds the threshold value, wherein the thermal control mechanism provides a proportional closed-loop feedback control response.

7. The method of claim 6, wherein collecting, at the memory controller, temperature data from the plurality of remote memory devices comprises:
    storing temperature data, for each memory device, in a corresponding temperature collection register.

8. The method of claim 6, wherein storing, in the memory controller, processed temperature data comprises storing a moving average temperature.

9. The method of claim 6, wherein initiating the thermal control mechanism, if the processed temperature data exceeds the thermal threshold value comprises at least one of:
    triggering an event; and
    initiating an automatic thermal throttle response.

10. The method of claim 9, wherein initiating the automatic thermal throttle response comprises:
    determining a difference between a processed temperature data value and a thermal threshold value;
    computing a control adjustment based, at least in part, on the difference between the processed temperature data value and the thermal threshold value; and
    applying a memory interface throttle based, at least in part, on the control adjustment.

11. The method of claim 10, further comprising:
incrementing a loop counter, the loop counter to provide an indication of a number of times the processed temperature data value exceeds the thermal threshold value.

12. The method of claim 11, wherein computing the control adjustment based, at least in part, on the difference between the processed temperature data value and the thermal threshold value further comprises:
altering the control adjustment based, at least in part, on a value of the loop counter.

13. A system comprising:
a memory module including a plurality of memory devices, each of the plurality of memory devices having an on-die thermal sensor; and
a memory controller coupled with the memory module through a memory interconnect the memory controller including
an interface to couple with a memory interconnect, the memory interconnect to transfer at least one of memory data or address information,
temperature collection logic coupled with the interface to receive and store temperature data from the plurality of memory devices, wherein the temperature data is to be continuously collected from the plurality of remote memory devices during inactive time on the memory interconnect that couples the memory controller to the plurality of remote memory devices, and further wherein the memory devices are to multiplex the temperature data onto the memory interconnect during the inactive time, and
control logic coupled with the temperature collection logic, the control logic to control a thermal throttle based, at least in part, on the temperature data, wherein the control logic provides a proportional closed-loop feedback control response.

14. The system of claim 13, wherein the temperature collection logic comprises:
a temperature collection register, for each memory device, to store temperature data for the corresponding memory device.

15. The system of claim 13, wherein the temperature collection logic further comprises:
one or more temperature collection control registers to store control information for the temperature collection logic.

16. The system of claim 13, wherein the control logic further comprises:
event steering logic to provide an event responsive, at least in part, to temperature data exceeding a thermal threshold value.

* * * * *